US 8,258,835 B1

(12) United States Patent
Morand et al.

(10) Patent No.: US 8,258,835 B1
(45) Date of Patent: Sep. 4, 2012

(54) CANCELLATION SYSTEM FOR PHASE JUMPS AT LOOP GAIN CHANGES IN FRACTIONAL-N FREQUENCY SYNTHESIZERS

(75) Inventors: Cedric Morand, Caen (FR); David Canard, Caen (FR)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 13/161,145

(22) Filed: Jun. 15, 2011

(51) Int. Cl.
*H03L 7/06* (2006.01)

(52) U.S. Cl. ........................................ 327/156; 327/147
(58) Field of Classification Search .................. 327/147, 327/156
See application file for complete search history.

(56) References Cited

U.S. PATENT DOCUMENTS

| | | | |
|---|---|---|---|
| 7,012,471 B2* | 3/2006 | Lyden et al. | 331/16 |
| 7,061,288 B2* | 6/2006 | Burgess | 327/156 |
| 7,065,025 B2* | 6/2006 | Kiyose | 369/53.34 |
| 7,602,253 B2* | 10/2009 | Kim et al. | 331/2 |
| 7,786,771 B2* | 8/2010 | Tsai et al. | 327/156 |
| 2003/0215026 A1* | 11/2003 | Hietala | 375/297 |
| 2004/0066220 A1* | 4/2004 | Chen | 327/157 |
| 2010/0011240 A1* | 1/2010 | Landolt | 714/10 |
| 2010/0315138 A1* | 12/2010 | Namba et al. | 327/157 |
| 2012/0074995 A1* | 3/2012 | Zhang | 327/156 |

* cited by examiner

*Primary Examiner* — Lincoln Donovan
*Assistant Examiner* — Adam Houston
(74) *Attorney, Agent, or Firm* — Morgan, Lewis & Bockius LLP (57) ABSTRACT

A fractional-N frequency synthesizer having a cancellation system for phase discontinuity due to loop gain changes may include a phase detector, a current-changeable charge-pump, a loop filter for providing a tuning signal, a voltage-controlled oscillator (VCO) controlled by the tuning signal for providing a VCO output signal, a divider for providing a divided VCO signal, a modulator for generating a modulating signal for fractional-N functionality, wherein the phase detector has a first input for receiving a reference signal oscillating at a reference frequency; a second input for receiving the divided signal; and the phase detector and charge-pump is configured to compare a phase of the first input and a phase of the second input, and generate a charge-pump current on and off, featuring that the cancellation system is implemented inside the modulator having an additional input defined by the changeable charge-pump current values.

14 Claims, 8 Drawing Sheets

CANCELLATION SYSTEM FOR PHASE JUMPS AT LOOP GAIN CHANGES IN FRACTIONAL-N FREQUENCY SYNTHESIZERS

FIELD OF INVENTION

The present invention relates generally to the field of a frequency synthesizer based on a phase lock loop and, in particular, to the field of a cancellation system for phase jumps at loop gain changes in a fractional-N frequency synthesizer.

BACKGROUND OF INVENTION

Current phase lock loop (PLL) based frequency synthesizers are feedback systems that may be used to create a signal with programmable frequency from a reference frequency. Such a frequency synthesizer may comprise a phase detector and charge-pump for producing an error signal that signifies the proportion of any phase difference between an output signal and an input reference frequency. In addition, current frequency synthesizers may also include features for feeding the error signal into a low-pass filter and then into a voltage-controlled oscillator (VCO) such that the output signal that is produced is synchronized with the input reference frequency to the frequency synthesizer. Current frequency synthesizers may employ the negative feedback loop method of feeding the output from the VCO back into the input of the phase frequency detector such that an error signal may be generated, coupling the output signal from the VCO to the input reference frequency. In some current frequency synthesizers, the output signal may be fed into a frequency divider circuit to produce an integer multiple of the input reference frequency.

Current frequency synthesizers can only generate a frequency at an integer multiple of the input reference frequency. To circumvent such restriction, the frequency synthesizer may further include a modulator to modulate the value of the division per frequency cycle to obtain a fractional value. Such a frequency synthesizer is called a fractional-N frequency synthesizer. The fractional-N frequency synthesizer can generate signals whose frequency is of the form:

$$F_{vco} = F_{reference} \times \left(INT + \frac{FRAC}{MOD}\right),$$

where INT, FRAC, and MOD are integers, and $F_{vco}$ is thus not necessarily an integer multiple of the reference frequency $F_{reference}$. Existing modulation may continuously create time differences at the input of the phase frequency detector, which in turn are converted into charge quantities by the charge-pump. Consequently, when switching the charge-pump current, a discontinuity in the time difference to charge quantity conversion factor can generate a phase disturbance and a loss of phase-lock. Some methods may rely on controlling the exact state of the modulator at a switching time to minimize the phase discontinuities. However, such methods can not compensate for the phase discontinuity without any constraint on the state of the modulator. In addition, such methods must include a look-up table with initialization values for the modulator on a per-channel basis.

SUMMARY OF THE INVENTION

Accordingly, the present invention is directed to a system and method for implementing a fractional-N frequency synthesizer having a cancellation system for a phase discontinuity due to loop gain changes that substantially obviates one or more problems due to limitations and disadvantages of the related art.

In an embodiment, provided is a fractional-N frequency synthesizer having a cancellation system for a phase discontinuity due to loop gain changes which is accompanied with a change of a charge-pump current value, including a phase detector, a current-changeable charge-pump, a loop filter for providing a tuning signal, a voltage-controlled oscillator (VCO) controlled by the tuning signal for providing a VCO output signal, a divider for providing a divided signal, and a modulator for generating a modulating signal for fractional-N functionality, wherein the phase detector comprises a first input for receiving a reference signal oscillating at a reference frequency, and a second input for receiving the divided signal from a voltage-controlled oscillator after the second input passes through a divider, wherein the phase detector and current-changeable charge-pump are configured to compare a phase of the first input and a phase of the second input and to generate a charge-pump current on and off, and wherein the cancellation system for a phase discontinuity is implemented inside the modulator, and the modulator has an additional input defined by the current-changeable charge-pump current values.

In a further embodiment, provided is a method implementing a fractional-N frequency synthesizer having a cancellation system for a phase discontinuity due to loop gain changes which is accompanied with a change of a charge-pump current value, the method comprising the steps of receiving a first input signal oscillating at a reference frequency, receiving a second input signal fed back from a voltage-controlled oscillator (VCO) after passing through a divider, comparing at a phase detector and current-changeable charge-pump a phase of the first input signal and a phase of the second input signal, and generating a charge-pump current on and off, wherein the cancellation system for a phase discontinuity implemented inside the modulator, wherein the modulator has an additional input defined by the current-changeable charge-pump current values, receiving the charge-pump current at a loop filter for providing a tuning signal, receiving the tuning signal at the voltage-controlled oscillator for providing a VCO output signal, receiving the VCO output signal at the divider for providing a divided signal, and receiving the divided signal at a modulator for generating a modulating signal.

In yet another embodiment, the modulator comprises at least one accumulator for generating the modulating signal.

In yet a further embodiment, provided is a modulator of a fractional-N frequency synthesizer having a cancellation system for a phase discontinuity due to loop gain changes which is accompanied with a change of a charge-pump current value, including a first accumulator for receiving an input signal as an usual input for a modulator, a second accumulator for receiving a compensation signal configured to compensate the phase discontinuity due to loop gain changes which is accompanied with a change of a charge-pump current value and a first output from the first accumulator, a third accumulator for receiving a second output from the second accumulator, and a cancellation system for receiving a compensation value defined by the current-changeable changeable charge-pump current values and outputting the compensation signal to the second accumulator.

In yet another embodiment, each of the first accumulator, the second accumulator and the third accumulator further comprises an adder and a register.

In yet another embodiment, the cancellation system further comprises a multiplexer, a signal switch, an adder, and a register.

In yet another embodiment, the compensation value depends on two-state current-changeable charge-pump current values at an initial state and a final state.

In yet another embodiment, the compensation signal satisfies an equation of $$B_{comp} = \frac{I_{cp0} - I_{cp1}}{I_{cp1}} \times (B[ks-1] - 2^n \times cC[ks]),$$

wherein ks is a cycle index of the charge-pump current, $I_{cp0}$ is a charge-pump current value at an initial state, $I_{cp1}$ is a charge-pump current value at a final state, $B[ks-1]$ is an output signal of the second accumulator at (ks−1)th cycle, and c $C[ks]$ is an output signal of the third accumulator at ksth cycle.

In yet a further embodiment, the present invention provides a method implemented using a modulator of a fractional-N frequency synthesizer having a cancellation system for a phase discontinuity due to loop gain changes which is accompanied with a change of a charge-pump current value, the method comprising the steps of receiving an input signal as an usual input for a modulator at a first accumulator, receiving a compensation signal and a first output from the first accumulator at a second accumulator, receiving a second output from the second accumulator at a third accumulator, and receiving a compensation value defined by the changeable charge-pump current values at a cancellation system and outputting the compensation signal to the second accumulator.

In yet another embodiment, each of the first accumulator, the second accumulator and the third accumulator further comprises an adder and a register.

In yet another embodiment, the cancellation system further comprises a multiplexer, a signal switch, an adder, and a register.

In yet another embodiment, the compensation value depends on two-stage changeable charge-pump current values at an initial state and a final state.

In yet another embodiment, the compensation signal satisfies an equation of $$B_{comp} = \frac{I_{cp0} - I_{cp1}}{I_{cp1}} \times (B[ks-1] - 2^n \times cC[ks]),$$

wherein ks is a cycle index of the charge-pump current, $I_{cp0}$ is a charge-pump current value at an initial state, $I_{cp1}$ is a charge-pump current value at a final state, $B[ks-1]$ is an output signal of the second accumulator at (ks−1)th cycle, and c $C[ks]$ is an output signal of the third accumulator at ksth cycle.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of the specification, illustrate embodiments of the invention and together with the description serve to explain the principles of the invention. In the drawings.

DETAILED DESCRIPTION

Reference will now be made in detail to embodiments, examples of which are illustrated in the accompanying drawings. In the following detailed description, numerous non-limiting specific details are set forth in order to assist in understanding the subject matter presented herein. It will be apparent, however, to one of ordinary skill in the art that various alternatives may be used without departing from the scope of the present invention and the subject matter may be practiced without these specific details. For example, it will be apparent to one of ordinary skill in the art that the subject matter presented herein can be implemented on any type of fractional-N frequency synthesizer.

Figure 1:
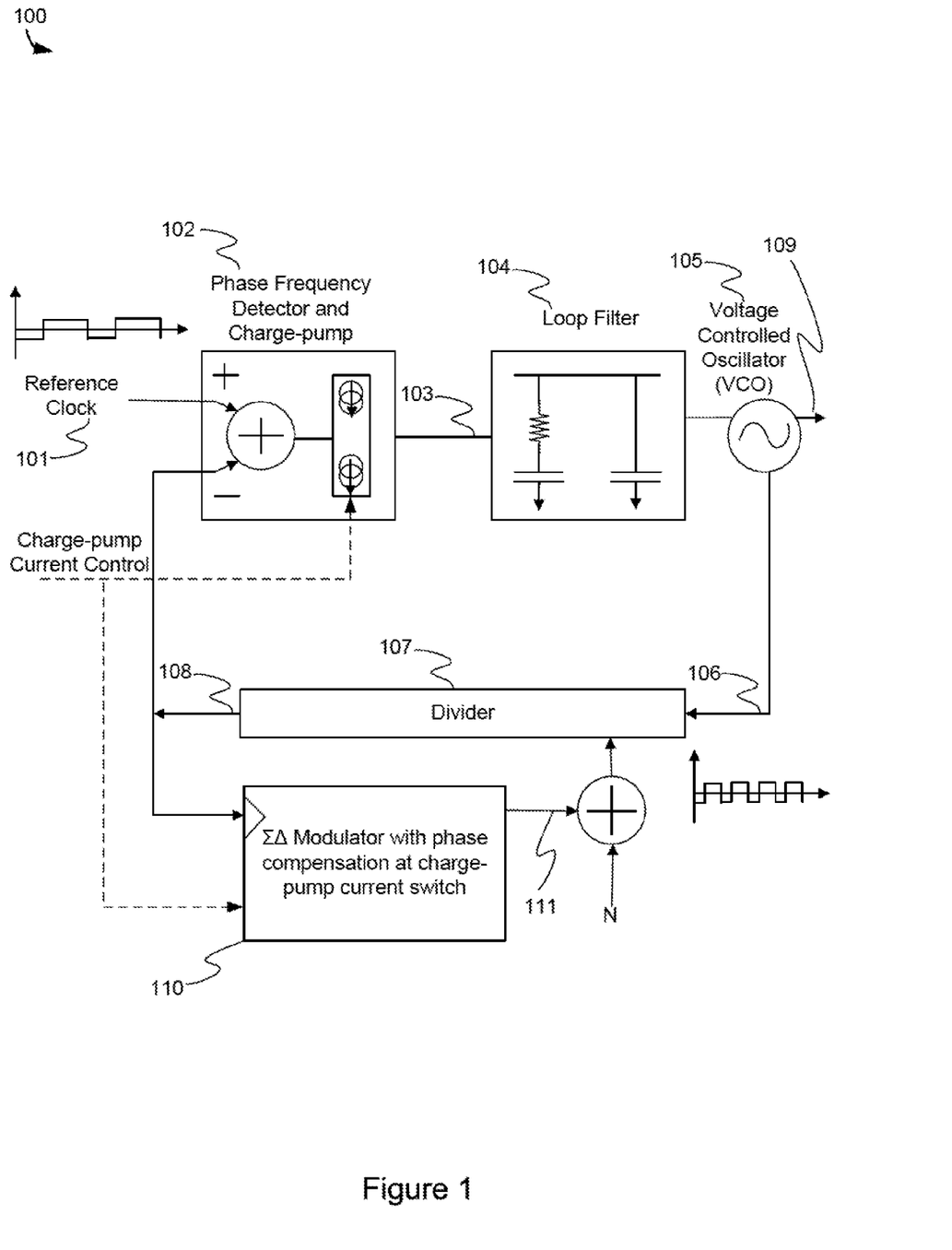
FIG. 1 illustrates an exemplary embodiment of a fractional-N frequency synthesizer having a cancellation system in accordance with the present invention.

FIG. 1 illustrates an exemplary embodiment 100 of a fractional-N frequency synthesizer with a loop filter 104 in series with a phase detector and charge-pump 102 in accordance with the present invention. In the exemplary embodiment 100, a reference clock signal 101 may be an input to the phase detector and charge-pump 102 along with the output divided VCO signal 108 from a divider 107. The phase detector and charge-pump 102 may detect the phase difference between the reference clock signal 101 and the output divided VCO signal 108 and convert it into an error output signal 103. The error output signal 103 from the phase detector and charge-pump 102 may be integrated by the loop filter 104 to generate a tuning voltage input to the VCO 105. The loop filter 104 is generally a passive circuit. The loop filter 104 may improve the spectral purity of the VCO output signal 109 by filtering the charge-pump 102 current pulses. A first output signal 109 from the VCO 105 may be used as the input, for example, to a device connected to the VCO 105. A second output signal 106 from the VCO 105 may be used to create a negative feedback loop circuit through the divider 107 for use as an input to the phase detector and charge-pump 102.

In some embodiments, the dividing ratio of the divider 107 may be modulated from cycle to cycle by the output signal from a modulator 110. The modulator 110 may use the divided VCO signal 108 as its clock input signal. The digital signal 111 generated by the modulator 110 may be added to a predetermined integer N and fed to the dividing ratio control input of the divider 107. As a result, the average dividing ratio of the divider may not be an integer number and the frequency of the VCO output signal 109 may not necessarily be an integer multiple of the reference frequency 101.

Figure 2:
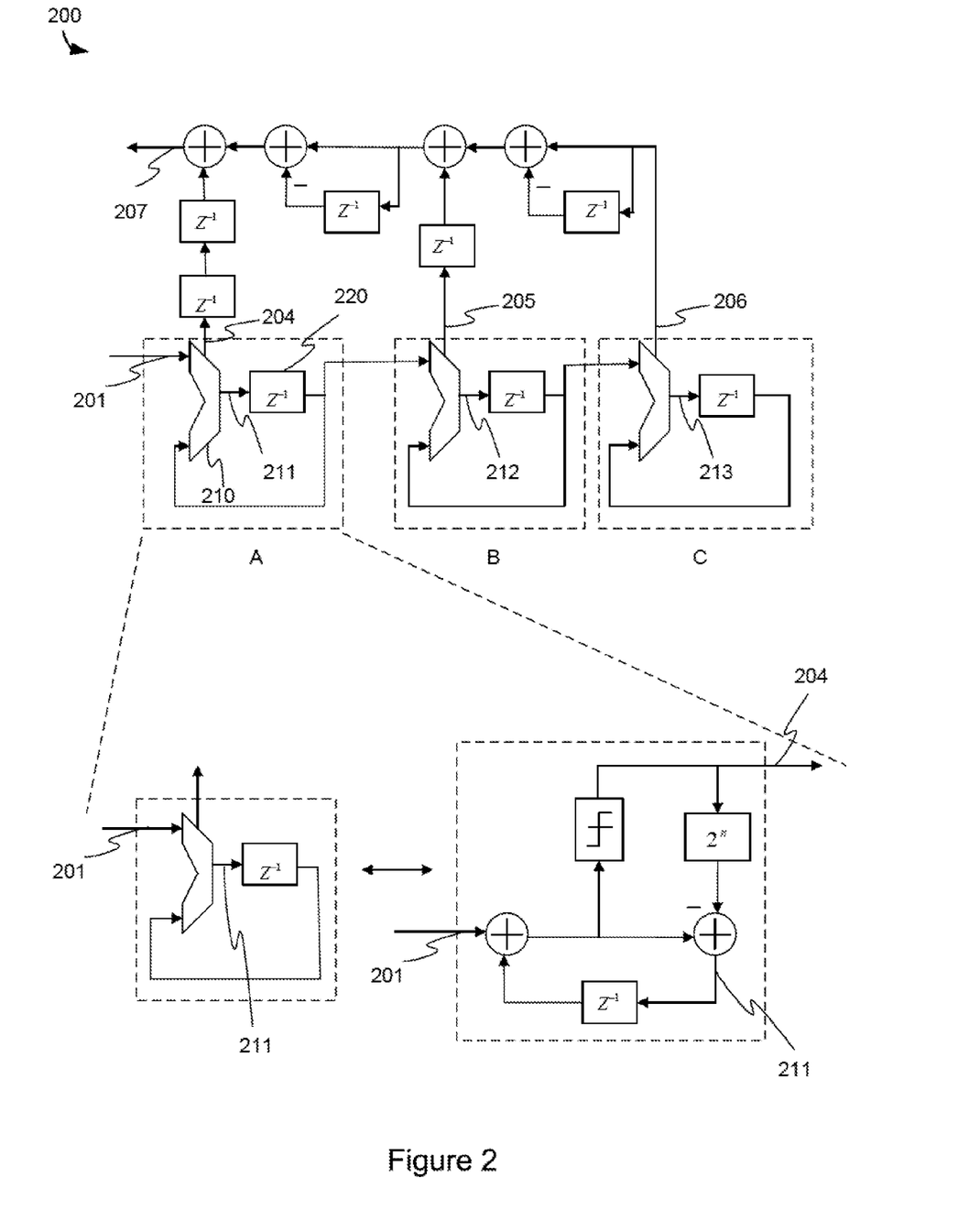
FIG. 2 illustrates an exemplary embodiment of a modulator of a fractional-N frequency synthesizer in accordance with the present invention.

FIG. 2 illustrates an exemplary embodiment 200 of a modulator of a fractional-N frequency synthesizer. In some embodiment, the modulator 110 may comprise at least one accumulator for generating the modulating signal. Each accumulator may comprise at least one adder and one register. For example, in FIG. 2, accumulator A includes an adder 210 and a register 220. Assuming that the initial integer value of the input signal 201 of the modulator 110 is FRAC, from the modulator configuration illustrated in FIG. 2, the generated modulating signal 207 at the kth cycle may be obtained as follows:

$$\Delta N_{divider}[k] = cA[k-2] + cB[k-1] - cB[k-2] + cC[k] - 2 \times cC[k-1] + cC[k-2]$$

where $\Delta N_{divider}[k]$ is the generated modulating signal 207 at the kth cycle, and cA[k], cB[k], and cC[k] are carry output signals 204, 205, and 206 of the three accumulators A, B, and C, respectively.

In the frequency synthesizer, the period of the output divided VCO signal 108 from the divider 107 at the kth cycle may be expressed as follows:

$$T_{divider}[k] = \frac{N + \Delta N_{divider}[k]}{f_{vco}}$$

where $T_{divider}[k]$ is the period of the divided VCO signal 108 from the divider 107 at the kth cycle, N is a pre-determined integer input to the divider 107, and $f_{vco}$ is the frequency of the VCO output signal 109, as illustrated in FIG. 1.

From the configuration of the phase detector and charge-pump 102, the loop filter 104 and the voltage controlled oscillator as illustrated in FIG. 1, $f_{vco}$ may be derived as $$f_{vco} = \left(N + \frac{FRAC}{2^n}\right) \times f_{reference}, \text{ where } f_{reference}$$

is the reference lock frequency 101.

Then at the kth cycle, a time difference $e_{PFD}[k]$ may occur at the input of phase detector and charge-pump 102 as follows:

$$e_{PFD}[k] = T_{divider}[k] - T_{reference} =$$

$$\frac{N + \Delta N_{divider}[k]}{f_{vco}} - \frac{N + \frac{FRAC}{2^n}}{f_{vco}} = \frac{\Delta N_{divider}[k] - \frac{FRAC}{2^n}}{f_{vco}}$$

As the absolute number of periods counted by the divider 107 is the sum of all instantaneous counts up to the current time, assuming that the VCO operates at a constant frequency, the time difference $e_{PFD}[k]$ may be the sum of time differences from all past cycles as follows:

$$e_{PFD}[k] =$$

$$\sum_{m=0}^{k} e[m] = \frac{1}{f_{vco}} \times \sum_{m=0}^{k} \left(cA[m-2] + cB[m-1] - cB[m-2] + cC[m] - 2 \times cC[m-1] + cC[m-2] - \frac{FRAC}{2^n}\right)$$

The summation may be re-arranged into:

$$\sum_{m=0}^{k} \left(cA[m-2] - \frac{FRAC}{2^n}\right) + \sum_{m=0}^{k} (cB[m-1] - cB[m-2]) +$$

$$\sum_{m=0}^{k} (cC[m] - cC[m-1]) - \sum_{m=0}^{k} (cC[m-1] - cC[m-2])$$

Looking at the different terms:

$$\sum_{m=0}^{k} (cB[m-1] - cB[m-2]) = cB[k-1] - cB[-2] = cB[k-1],$$

as $cB[m] = 0$ for $m \leq 0$, and similarly:

$$\sum_{m=0}^{k} (cC[m] - cC[m-1]) = cC[k]$$

$$\sum_{m=0}^{k} (cC[m-1] - cC[m-2]) = cC[k-1]$$

From the configuration of accumulator A as illustrated in FIG. 2, we obtain: $A[m-1]+FRAC=A[m]+cA[m]\times 2^n$, then the expression of two times delay may be re-arranged to: $FRAC-cA[m-2]\times 2^n = A[m-2]-A[m-3]$, where A[m] is an output signal 211 of the first accumulator A at the kth cycle.

We get:

$$\sum_{m=0}^{k} \left(cA[m-2] - \frac{FRAC}{2^n}\right) = -\frac{\sum_{m=0}^{k}(A[m-2] - A[m-3])}{2^n} = -\frac{A[k-2]}{2^n},$$

as $A[m] = 0$ for $m \leq 0$.

Summing all the terms, we obtain:

$$e_{PFD}[k] = \frac{1}{f_{vco}} \times \left(cB[k-1] + cC[k] - cC[k-1] - \frac{A[k-2]}{2^n}\right)$$

The time difference $e_{PFD}[k]$ at the input of the phase detector may be converted into a charge by the charge-pump. The output signal 103 of the phase detector and charge-pump 120 is proportional to an instantaneous phase error at the kth cycle: $\Delta\Phi[k] = e_{PFD}[k] \times I_{cp}[k]$, where $I_{cp}[k]$ is a programmed charge-pump current at the kth cycle.

Summing all the instantaneous phase error at the kth cycle to build an image of the synthesized phase, we obtain:

$$\Phi[k] = \sum_{m=0}^{k} \Delta\Phi[m] = \sum_{m=0}^{k} (e_{PFD}[m] \times I_{cp}[m]) + \Lambda,$$

where $\Lambda$ is an integration constant.

The sum $\Phi[k]$ may be a defined value when the phase lock loop is locked. Thus, the mean of $\Delta\Phi[k]$ is zero, and $\Phi[k]$ is evolving around a finite mean value $$\overline{\Phi[k]} = \sum_{m=0}^{k} e_{PFD}[m] \times I_{cp}[m] + \Lambda,$$

which represents the absolute mean phase from the modulation.

The mean value $\overline{\Phi[k]}$ must remain constant before and after the switch of the charge-pump so that no disturbance is generated on the voltage controlled oscillator. The future sequence of the modulator output, however, may be unknown at the switching point and so may be the future mean phase value. To circumvent this issue one may rely on the spectral properties of the sequence. For example, knowing that its power is located mainly in the high frequencies, it can be inferred that truncated parts of a larger sequence may produce the same mean phase when the charge-pump current is constant. Accordingly, in some embodiments, instead of searching for a continuity on a whole sequence prior to and after the switch of the charge-pump, a compensation value can be computed based on the known past sequence at the initial $I_{cp}(\rightarrow I_{cp0})$ compared to the same sequence but at final $I_{cp}$ ($\rightarrow I_{cp1}$).

Figure 3:
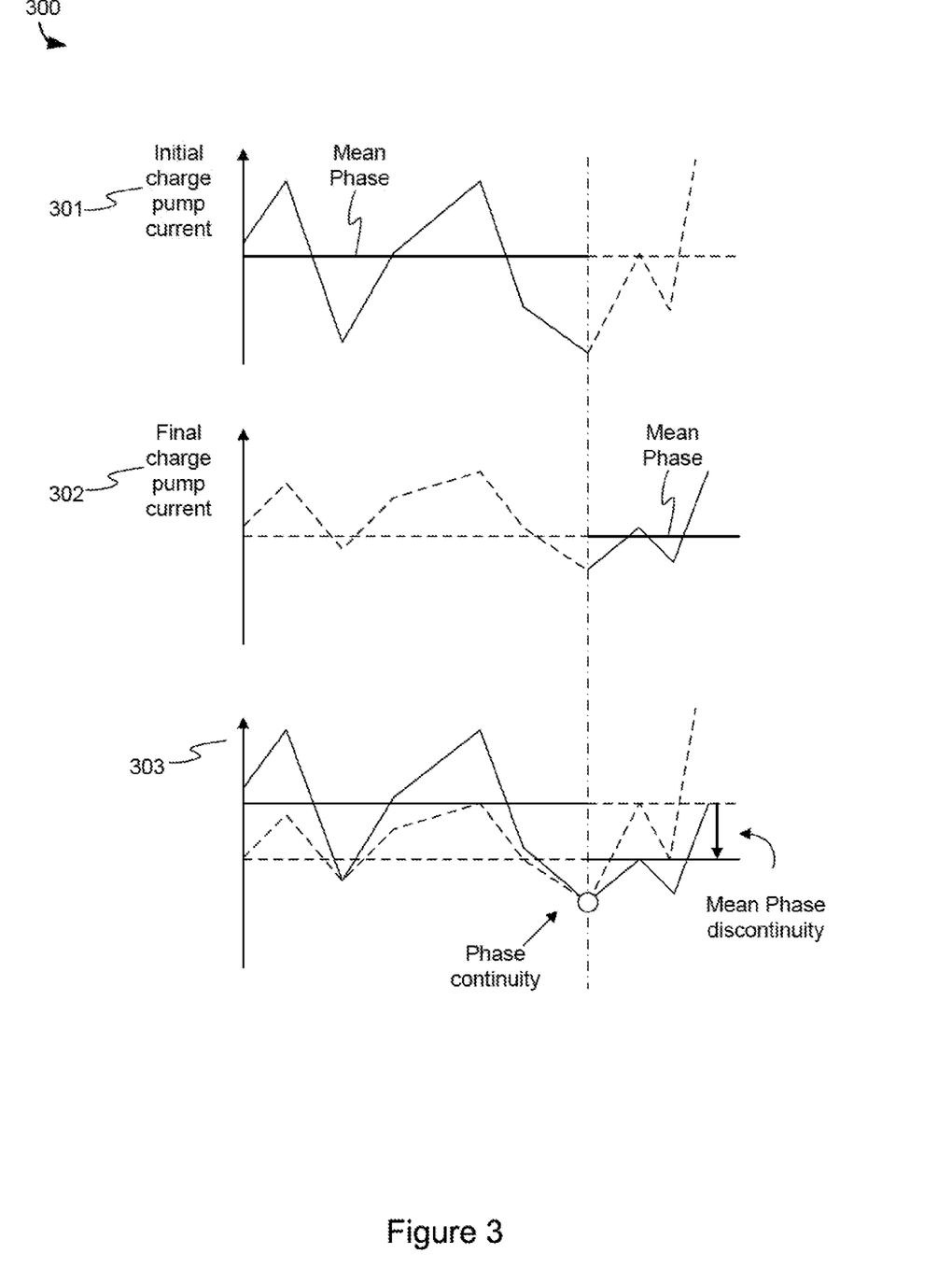
FIG. 3 illustrates an exemplary illustration of a mean phase discontinuity that may occur due to a change in the charge-pump current.

FIG. 3 illustrates an exemplary illustration of a mean phase discontinuity that may occur due to a change in the charge-pump current. The top graph 301 depicts the phase trajectory due to the Sigma-Delta modulation at the initial charge-pump setting (solid line) and what it would be without change (dotted line). This phase is evolving around its mean value (horizontal line). The middle graph 302 depicts the phase trajectory as it would have existed before the change with the final charge-pump setting (dotted line) and what it becomes after the change (solid line). Again, the mean phase is given by the horizontal line. The bottom FIG. 303 describes the actual phase trajectory around the change. The phase is continuous at the switching point and so the solid lines with the initial and final charge-pump settings are connected. This triggers a discontinuity in the mean phase, however.

Considering an initial sequence with $I_{cp}[k]=I_{cp0}$ may be a constant, we obtain the initial phase trajectory illustrated in FIG. 3 as:

$$\Phi_0[k] = \sum_{m=0}^{k} (e_{PFD}[m] \times I_{cp0}) + \Lambda_0 = I_{cp0} \times \sum_{m=0}^{k} e_{PFD}[m] + \Lambda_0$$

Considering the same sequence with $I_{cp}[k]=I_{cp1}$ may be a constant, we obtain the final phase trajectory illustrated in FIG. 3 as:

$$\Phi_1[k] = \sum_{m=0}^{k} (e_{PFD}[m] \times I_{cp1}) + \Lambda_1 = I_{cp1} \times \sum_{m=0}^{k} e_{PFD}[m] + \Lambda_1$$

If the phase is continuous before and after the switch of the charge-pump as $\Phi_1[ks]=(I)=\Phi_0[ks]$, where ks corresponds to the switch from $I_{cp0}$ to $I_{cp1}$, we obtain $$\Lambda_1 = \Lambda_0 + (I_{cp0} - I_{cp1}) \times \sum_{m=0}^{k} e_{PFD}[m]$$

Now computing the respective mean phases, we obtain:

$$\overline{\Phi_0[k]} = I_{cp0} \times \sum_{m=0}^{k} e_{PFD}[m] + \Lambda_0 \text{ and}$$

$$\overline{\Phi_1[k]} = I_{cp1} \times \overline{\sum_{m=0}^{k} e_{PFD}[m]} + \Lambda_1 =$$

$$I_{cp1} \times \overline{\sum_{m=0}^{k} e_{PFD}[m]} + \Lambda_0 + (I_{cp0} - I_{cp1}) \times \sum_{m=0}^{k} e_{PFD}[m]$$

The mean phase discontinuity that will be compensated after the switch of the charge-pump in one embodiment of the present invention is:

$$\Delta\Phi = \overline{\Phi_1[k]} - \overline{\Phi_0[k]} = (I_{cp0} - I_{cp1}) \times \left[ \sum_{m=0}^{k} e_{PFD}[m] - \overline{\sum_{m=0}^{k} e_{PFD}[m]} \right],$$

as illustrated in FIG. 3.

From the computation of $e_{PFD}[k]$, a closed-form expression for $$\sum_{m=0}^{k} e_{PFD}[m]$$

is:

$$\sum_{m=0}^{k} e_{PFD}[m] = \sum_{m=0}^{k} \left[ cB[m-1] + cC[m] - cC[m-1] - \frac{A[m-2]}{2^n} \right] =$$

$$cC[k] + \sum_{m=0}^{k} \left[ cB[m-1] - \frac{A[m-2]}{2^n} \right]$$

From the configuration of the second accumulator B, we obtain: $B[k]+A[k]=B[k+1]+cB[k+1]\times 2^n$, then $A[k-2]=B[k-1]-B[k-2]+cB[k-1]\times 2^n$, where $B[m]$ is an output signal 212 of the second accumulator B at the kth cycle shown in FIG. 2.

From the computation of the closed-form expression for, $$\sum_{m=0}^{k} e_{PFD}[m],$$

we have:

$$\sum_{m=0}^{k} \left[ cB[m-1] - \frac{A[m-2]}{2^n} \right] =$$

$$-\sum_{m=0}^{k} \left[ cB[m-1] - cB[m-1] + \frac{B[m-1] - B[m-2]}{2^n} \right] = -\frac{B[k-1]}{2^n},$$

where $B[0]=cB[0]=0$ may be the initialization condition of the modulator at each new re-lock phase.

The closed-form expression for $$\sum_{m=0}^{k} e_{PFD}[m]$$

may be expressed finally as follows:

$$\sum_{m=0}^{k} e_{PFD}[m] = -\frac{B[k-1]}{2^n} + cC[k]$$

Thus, the expression of the mean phase discontinuity becomes:

$$\Delta\overline{\Phi} = (I_{cp0} - I_{cp1}) \times \left[-\frac{B[k-1]}{2^n} + cC[ks] - \overline{\sum_{m=0}^{k} e_{PFD}[m]}\right]$$

The phase after the switch of the charge-pump is:

$$\Phi_1[k] = I_{cp1} \times \sum_{m=0}^{k} e_{PFD}[m] + \Lambda_1 = I_{cp1} \times \left[-\frac{B[k-1]}{2^n} + cC[k]\right] + \Lambda_1$$

To compensate for the discontinuity between the mean phases, it is possible to add an offset to $\Phi_1[k]$ after the switch of the charge-pump. In some embodiments, this can be achieved by adding an offset $B_{comp}$ to the second accumulator B:

$$\Phi_{1,comp}[k] = \Phi_1[k] - \Delta\overline{\Phi} \text{ with } \Phi_{1,comp}[k] =$$

$$I_{cp1} \times \left[-\frac{B[k-1] + B_{comp}}{2^n} + cC[k]\right] + \Lambda_1 = \Phi_1[k] + I_{cp1} \times \frac{B_{comp}}{2^n}$$

Identifying the two terms $\Phi_{1,comp}[k] = \Phi_1[k] - \Delta\overline{\Phi}$, we get:

$$I_{cp1} \times \frac{B_{comp}}{2^n} = (I_{cp0} - I_{cp1}) \times \left[-\frac{B[ks-1]}{2^n} - cC[ks] + \overline{\sum_{m=0}^{k} e_{PFD}[m]}\right]$$

The above expression can be re-arranged as:

$$B_{comp} = \frac{I_{cp0} - I_{cp1}}{I_{cp1}} \times \left[B[ks-1] - 2^n \times cC[ks] + 2^n \times \overline{\sum_{m=0}^{k} e_{PFD}[m]}\right] =$$

$$\frac{I_{cp0} - I_{cp1}}{I_{cp1}} \times [B[ks-1] - 2^n \times cC[ks] + \overline{(-B[m-1] + 2^n \times cC[m])}]$$

From the configuration of the third accumulator C, we have: $C[k] + B[k] = C[k+1] + cC[k+1] \times 2^n$, then $-B[k-1] + cC[k] \times 2^n = C[k-1] - C[k]$, where $C[m]$ is an output signal 213 of the first accumulator C at the kth cycle in FIG. 2. thus $-B[m-1] + 2^n \times cC[m] = \overline{C[m-1] - C[m]} \to 0$ Finally, the compensation signal $B_{comp}$ added to the second accumulator B is expressed as:

$$B_{comp} = \frac{I_{cp0} - I_{cp1}}{I_{cp1}} \times [B[ks-1] - 2^n \times cC[ks]],$$

where ks is the cycle index of the charge-pump current switching from $I_{cp0}$ to $I_{cp1}$.

Figure 4:
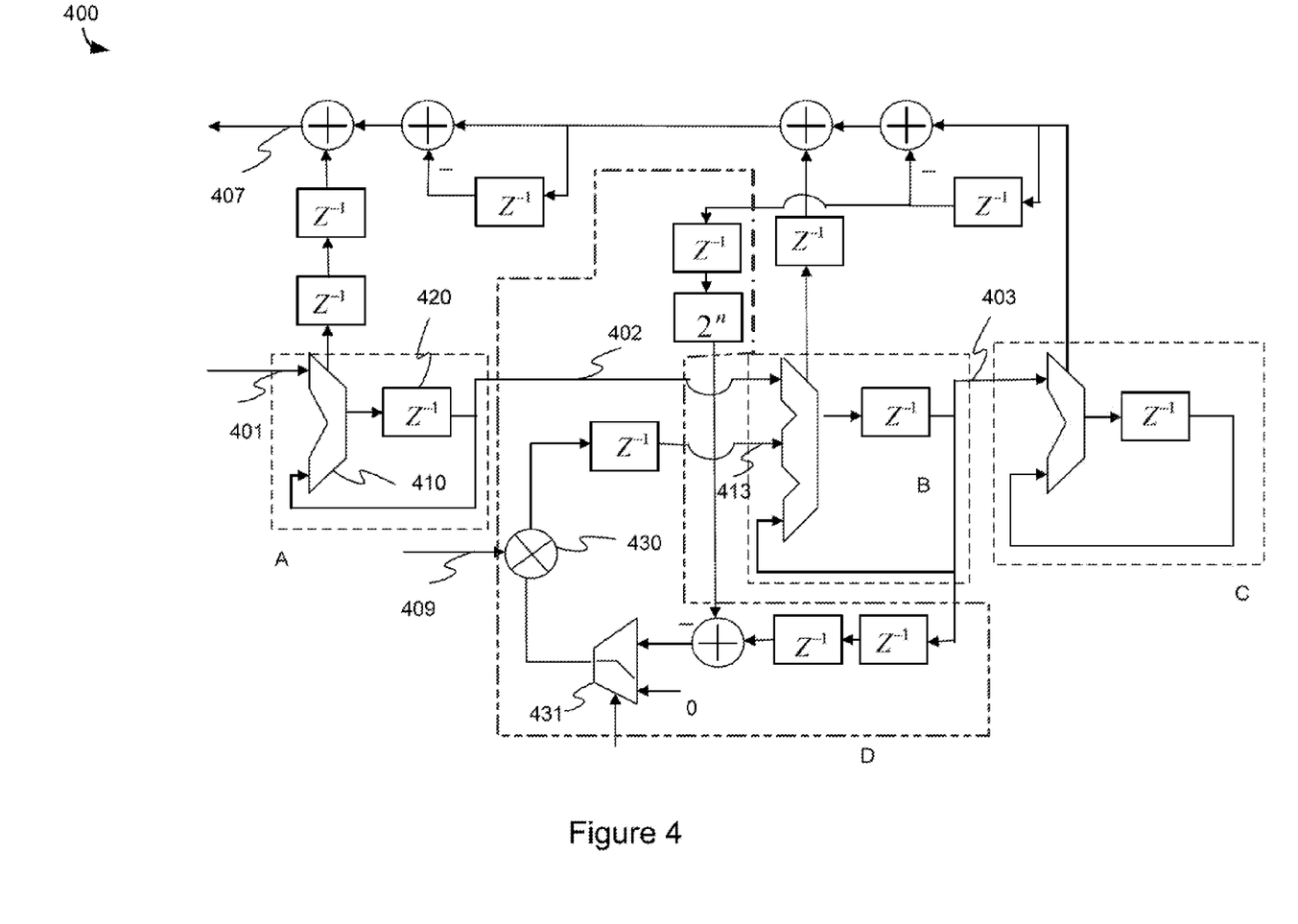
FIG. 4 illustrates an exemplary illustration of a modulator of a fractional-N frequency synthesizer having a cancellation system in accordance with the present invention.

FIG. 4 illustrates exemplary embodiment 400 of a modulator of a fractional-N frequency synthesizer having a cancellation system in accordance with the present invention. In some embodiments, the modulator of a fractional-N frequency synthesizer having a cancellation system comprises a first accumulator A for receiving an input signal 401, a second accumulator B for receiving a compensation signal 413 and a first output signal 402 from the first accumulator, a third accumulator C for receiving a second output signal 403 from the second accumulator, and a cancellation system D for receiving a compensation value 409 and outputting the compensation signal 413 to the second accumulator B, wherein the cancellation system D is configured to compensate for a phase discontinuity due to loop gain changes. In some embodiments, each of the first accumulator A, the second accumulator B and the third accumulator C comprises at least one adder and one register, for example, accumulator A of FIG. 4 includes an adder 410 and a register 420. In some embodiments, the cancellation system D further comprises a multiplexer 430, a signal switch 431, at least one adder and at least one register. The compensation value input into the cancellation system D depends on charge-pump signals at an initial state and a final state. In some embodiment, the compensation value 409 is configured as $$B_{comp} = \frac{I_{cp0} - I_{cp1}}{I_{cp1}} \times [B[ks-1] - 2^n \times cC[ks]],$$

where ks is the cycle index of the charge-pump current switching from $I_{cp0}$ to $I_{cp1}$.

Figure 5:
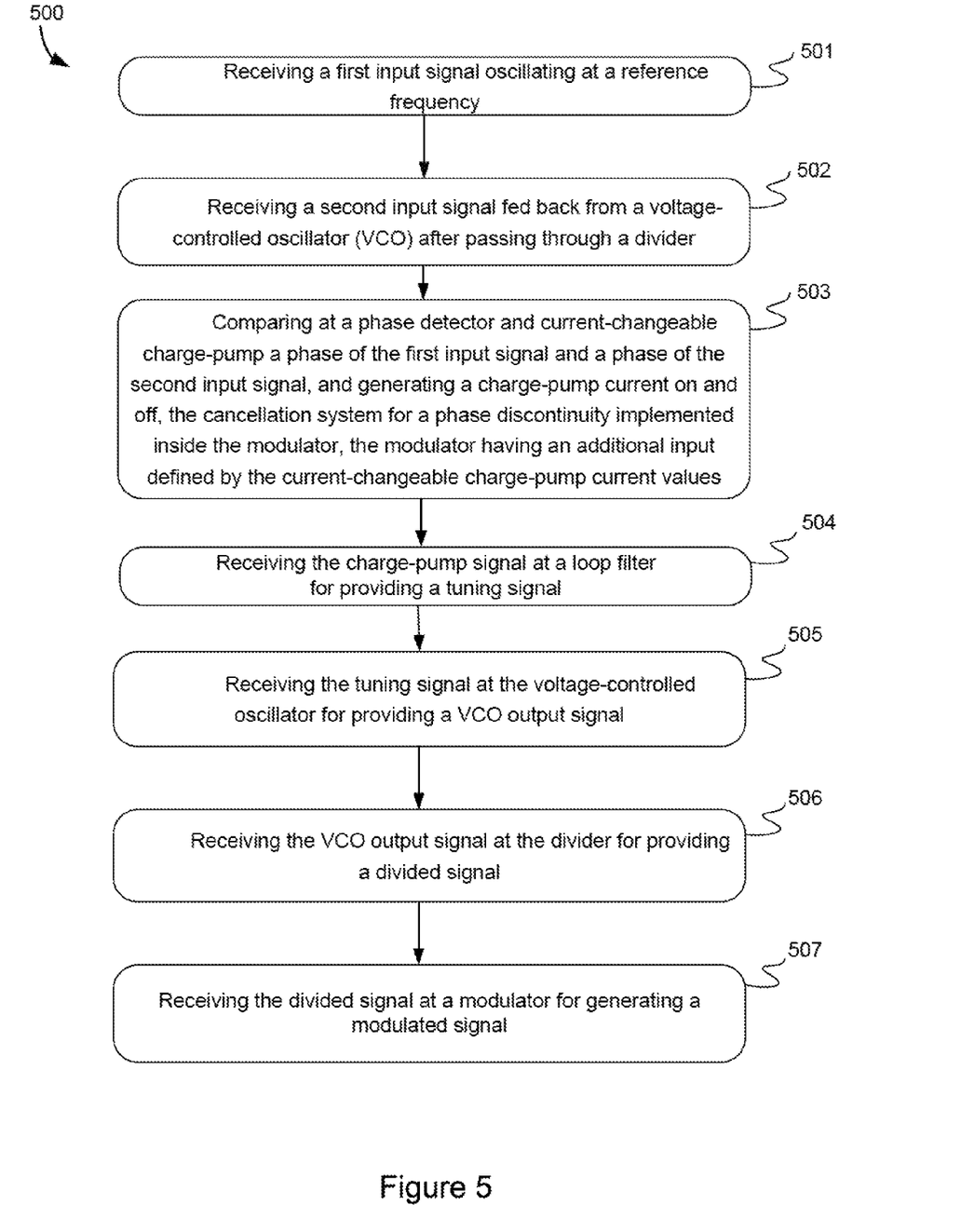
FIG. 5 illustrates exemplary fractional-N frequency synthesizer method steps in accordance with the present invention.

FIG. 5 illustrates exemplary fractional-N frequency synthesizer method steps in accordance with the present invention. The fractional-N frequency synthesizer method steps includes step 501 for receiving a first input signal oscillating at a reference frequency, step 502 for receiving a second input signal from a voltage-controlled oscillator (VCO) after passing through a divider, step 503 for comparing at a phase detector and current-changeable charge-pump a phase of the first input signal and a phase of the second input signal, and generating a charge-pump current on and off, the cancellation system for a phase discontinuity implemented inside the modulator, the modulator having an additional input defined by the current-changeable charge-pump current values, step 504 for receiving the charge-pump signal at a loop filter for providing a tuning signal, step 505 for receiving a tuning signal at the VCO for providing a VCO output signal, step 506 for receiving the VCO output signal at the divider for providing a divided VCO signal, and step 507 for receiving the divided VCO signal at a modulator for generating a modulating signal.

Figure 6:
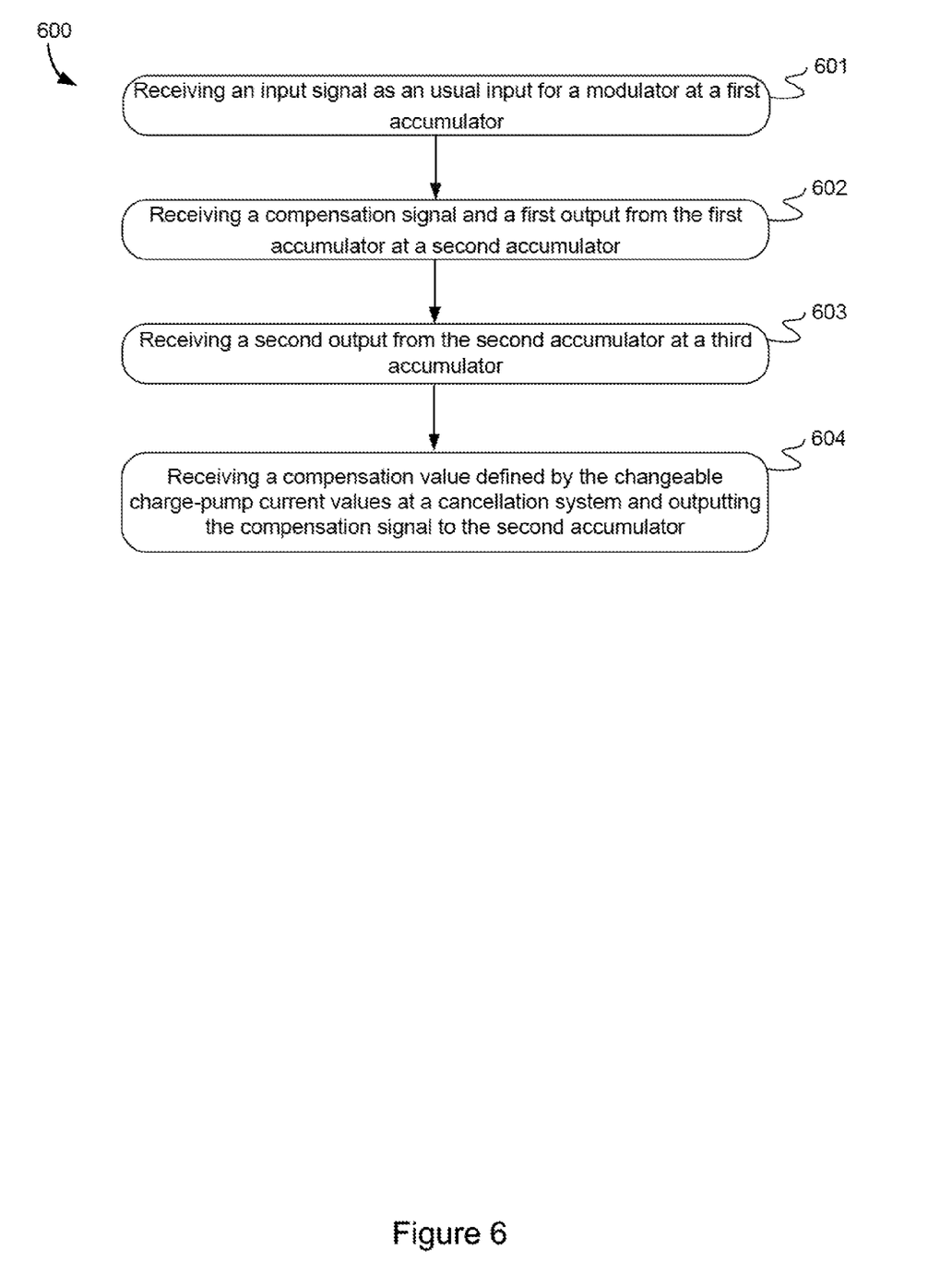
FIG. 6 illustrates exemplary modulator method steps in accordance with the present invention.

FIG. 6 illustrates exemplary modulator method steps in accordance with the present invention. The modulator method steps includes step 601 for receiving an input signal as an usual input for a modulator at a first accumulator, step 602 for receiving a compensation signal and a first input output from the first accumulator at a second accumulator, step 603 for receiving a second output from the second accumulator at a third accumulator, and step 604 for receiving a compensation value defined by the changeable charge-pump current values at a cancellation system and outputting the compensation signal to the second accumulator.

In some embodiments, a mean phase discontinuity cancellation is implemented in the modulator such that the phase discontinuities generated by changes of the charge-pump currents over the fractional-N modulation can be fully digitally compensated, without any constraint on the state of the modulator. Furthermore, no look-up table is needed in the embodiments of the present invention.

In some embodiments, a third-order MASH 1-1-1 modulator is used in the fractional-N frequency synthesizer whose lock-state must be maintained while switching the charge-pump current from $I_{cp0}$ to $I_{cp1}$ (continuity of the mean phase). However, a second-order MASH 1-1 modulator may be used in the fractional-N frequency synthesizer. In the case of a second-order MASH 1-1 modulator, the compensation value for the phase discontinuities is configured as $$B_{comp} = \frac{I_{cp0} - I_{cp1}}{I_{cp1}} \times (B[ks] - \overline{B[m]}),$$

where the average of the second accumulator $\overline{B[m]}$ can be conveniently estimated using a low-pass digital filter.

Figure 7:
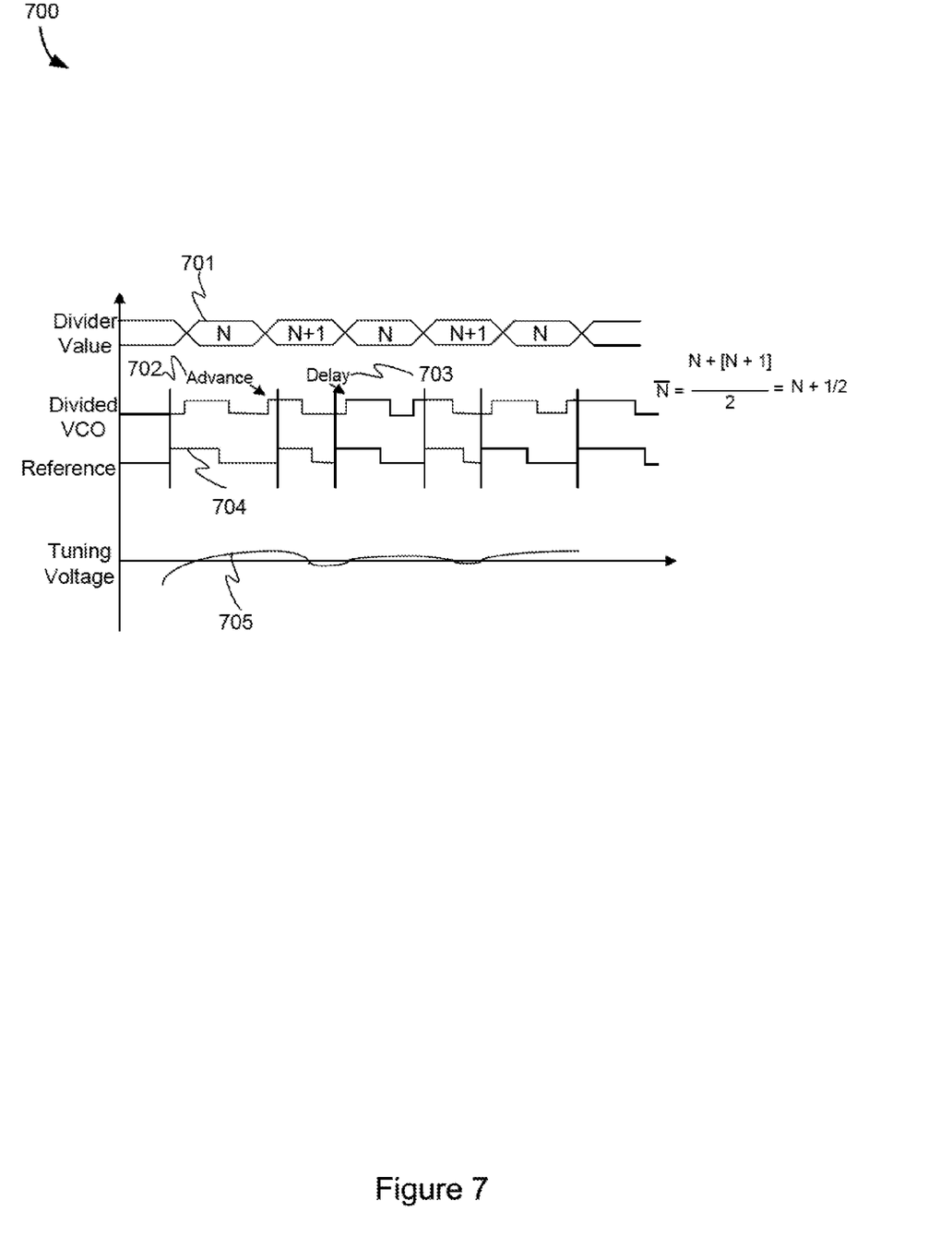
FIG. 7 illustrates an exemplary illustration of a signal diagram associated with fractional-N modulation in accordance with the present invention.

FIG. 7 illustrates an exemplary illustration 700 of a signal diagram associated with fractional-N modulation in accordance with the present invention. In exemplary illustration 700, shown are the relationships between a divider value signal 701, a divided VCO signal illustrating advance 702 and delay 703 representations of fractional values, a reference clock signal 704, and a tuning voltage signal 705. The value of the divided VCO signal with advance 702 and delay 704 representations may be obtained using the following formula for obtaining a fractional-N modulated signal.

$$\overline{N} = \frac{N + [N + 1]}{2} = N + 1/2$$

Figure 8:
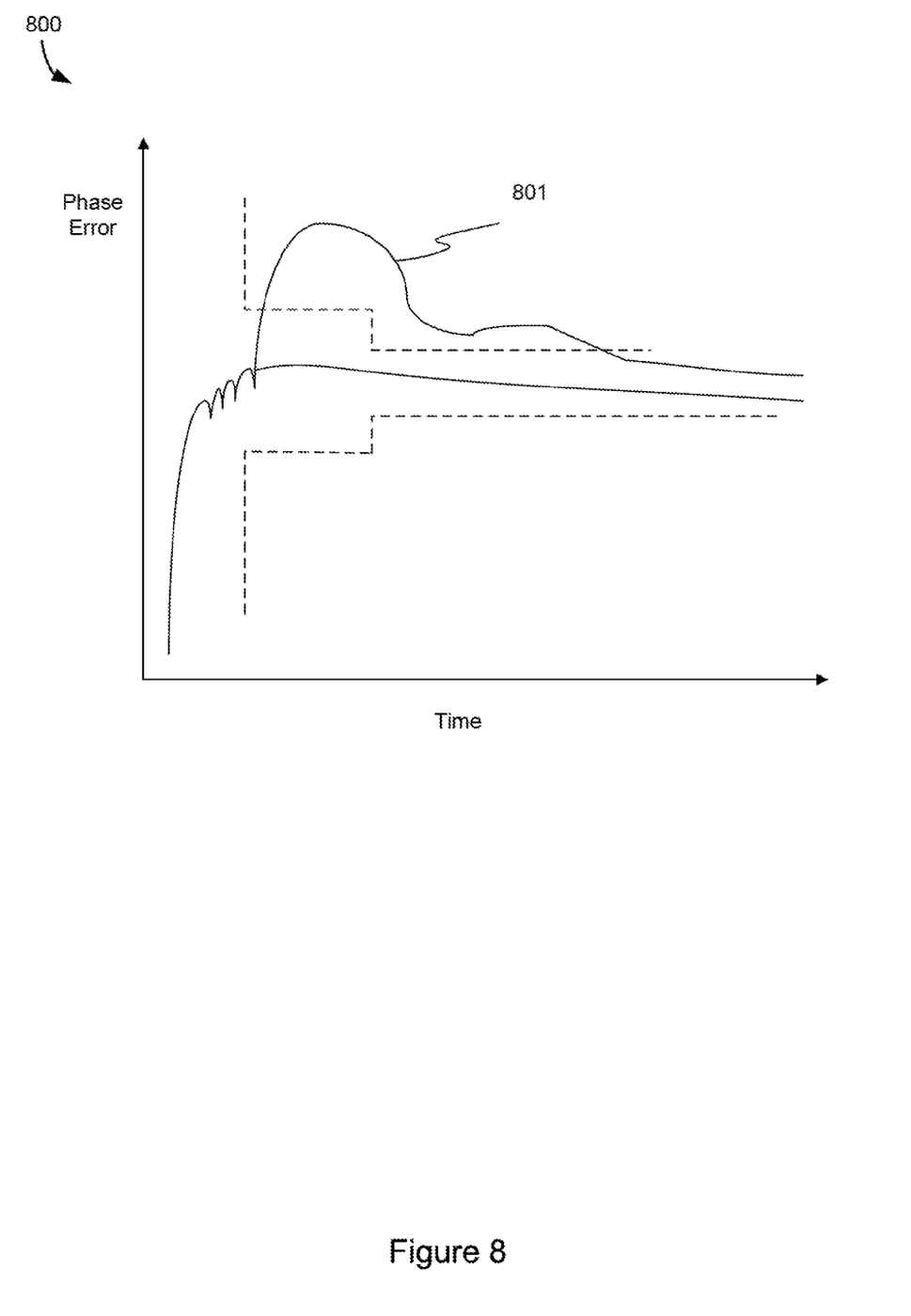
FIG. 8 illustrates exemplary phase trajectory during a fast-lock sequence in a fractional-N frequency synthesizer.

FIG. 8 illustrates exemplary illustration 800 of a phase trajectory during a fast-lock sequence in a fractional-N frequency synthesizer. In exemplary illustration 800, when switching the charge-pump current, the amplitude of the phase jump depends on the state of the modulator, a discontinuity in the sequence of charge injections 801 can generate a loss of phase-lock. There are two graphs in FIG. 8, and they are for a PLL without compensation. Depending on the state of the modulator when the change in the charge-pump current occurs, then the resulting phase error may or may not fail to meet the minimum error requirements.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

We claim:

1. A fractional-N frequency synthesizer having a cancellation system for a phase discontinuity due to loop gain changes which is accompanied with a change of a charge-pump current value, comprising:
a phase detector;
a current-changeable charge-pump;
a loop filter for providing a tuning signal;
a voltage-controlled oscillator (VCO) controlled by the tuning signal for providing a VCO output signal;
a divider for providing a divided signal; and
a modulator for generating a modulating signal for fractional-N functionality;
wherein the phase detector comprises:
a first input for receiving a reference signal oscillating at a reference frequency; and
a second input for receiving the divided signal from a voltage-controlled oscillator after the second input passes through a divider,
wherein the phase detector and current-changeable charge-pump is configured to compare a phase of the first input and a phase of the second input and to generate a charge-pump current on and off, and
wherein the cancellation system for a phase discontinuity is implemented inside the modulator, the modulator having an additional input defined by the current-changeable charge-pump current values.

2. The fractional-N frequency synthesizer having a cancellation system of claim 1, wherein the modulator comprises at least one accumulator for generating the modulating signal.

3. A method implementing a fractional-N frequency synthesizer having a cancellation system for a phase discontinuity due to loop gain changes which is accompanied with a change of a charge-pump current value, the method comprising the steps of:
receiving a first input signal oscillating at a reference frequency;
receiving a second input signal fed back from a voltage-controlled oscillator (VCO) after passing through a divider;
comparing at a phase detector and current-changeable charge-pump a phase of the first input signal and a phase of the second input signal, and generating a charge-pump current on and off, the cancellation system for a phase discontinuity implemented inside the modulator, the modulator having an additional input defined by the current-changeable charge-pump current values;
receiving the charge-pump current at a loop filter for providing a tuning signal;
receiving the tuning signal at the voltage-controlled oscillator for providing a VCO output signal;
receiving the VCO output signal at the divider for providing a divided signal; and
receiving the divided signal at a modulator for generating a modulating signal.

4. The method of claim 3, wherein the modulator comprises at least one accumulator for generating the modulating signal.

5. A modulator of a fractional-N frequency synthesizer having a cancellation system for a phase discontinuity due to loop gain changes which is accompanied with a change of a charge-pump current value, with the modulator comprising:
a first accumulator for receiving an input signal as an usual input for a modulator;
a second accumulator for receiving a compensation signal configured to compensate the phase discontinuity due to loop gain changes which is accompanied with a change of a charge-pump current value and a first output from the first accumulator;
a third accumulator for receiving a second output from the second accumulator; and
a cancellation system for receiving a compensation value defined by the current-changeable changeable charge-pump current values and outputting the compensation signal to the second accumulator.

6. The modulator of a fractional-N frequency synthesizer having a cancellation system of claim 5, wherein each of the first accumulator, the second accumulator and the third accumulator further comprises an adder and a register.

7. The modulator of a fractional-N frequency synthesizer having a cancellation system of claim 5, wherein the cancellation system further comprises a multiplexer, a signal switch, an adder, and a register.

8. The modulator of a fractional-N frequency synthesizer having a cancellation system of claim 5, wherein the compensation value depends on two-state current-changeable charge-pump current values at an initial state and a final state.

9. The modulator of a fractional-N frequency synthesizer having a cancellation system of claim 5, wherein the compensation signal satisfies an equation of $$B_{comp} = \frac{I_{cp0} - I_{cp1}}{I_{cp1}} \times [B[ks-1] - 2^n \times cC[ks]],$$

wherein ks is a cycle index of the charge-pump current, $I_{cp0}$ is a charge-pump current value at an initial state, $I_{cp1}$ is a charge-pump current value at a final state, B[ks−1] is an output signal of the second accumulator at (ks−1)th cycle, and c C[ks] is an output signal of the third accumulator at ksth cycle.

10. A method implemented using a modulator of a fractional-N frequency synthesizer having a cancellation system for a phase discontinuity due to loop gain changes which is accompanied with a change of a charge-pump current value, the method comprising the steps of:

receiving an input signal as an usual input for a modulator at a first accumulator;

receiving a compensation signal and a first output from the first accumulator at a second accumulator;

receiving a second output from the second accumulator at a third accumulator; and receiving a compensation value defined by the changeable charge-pump current values at a cancellation system and outputting the compensation signal to the second accumulator.

11. The method of claim 10, wherein each of the first accumulator, the second accumulator and the third accumulator further comprises an adder and a register.

12. The method of claim 10, wherein the cancellation system further comprises a multiplexer, a signal switch, an adder, and a register.

13. The method of claim 10, wherein the compensation value depends on two-stage changeable charge-pump current values at an initial state and a final state.

14. The method of claim 10, wherein the compensation signal satisfies an equation of $$B_{comp} = \frac{I_{cp0} - I_{cp1}}{I_{cp1}} \times [B[ks-1] - 2^n \times cC[ks]],$$

wherein ks is a cycle index of the charge-pump current, $I_{cp0}$ is a charge-pump current value at an initial state, $I_{cp1}$ is a charge-pump current value at a final state, B[ks−1] is an output signal of the second accumulator at (ks−1)th cycle, and cC[ks] is an output signal of the third accumulator at ksth cycle.

* * * * *